United States Patent
Qian et al.

(10) Patent No.: US 12,329,033 B2
(45) Date of Patent: *Jun. 10, 2025

(54) PIEZOELECTRIC SENSOR WITH INCREASED SENSITIVITY AND DEVICES HAVING THE SAME

(71) Applicant: Skyworks Solutions, Inc., Irvine, CA (US)

(72) Inventors: You Qian, Singapore (SG); Humberto Campanella-Pineda, Singapore (SG); Guofeng Chen, Fremont, CA (US); Rakesh Kumar, Singapore (SG)

(73) Assignee: Skyworks Solutions, Inc., Irvine, CA (US)

(*) Notice: Subject to any disclaimer, the term of this patent is extended or adjusted under 35 U.S.C. 154(b) by 322 days.

This patent is subject to a terminal disclaimer.

(21) Appl. No.: 18/047,443

(22) Filed: Oct. 18, 2022

(65) Prior Publication Data

US 2023/0125523 A1 Apr. 27, 2023

Related U.S. Application Data

(60) Provisional application No. 63/262,823, filed on Oct. 21, 2021, provisional application No. 63/262,825, filed on Oct. 21, 2021.

(51) Int. Cl.
*H10N 30/08* (2023.01)
*B81B 3/00* (2006.01)
(Continued)

(52) U.S. Cl.
CPC .......... *H10N 30/08* (2023.02); *B81B 3/0018* (2013.01); *B81C 1/0015* (2013.01); *H04R 3/005* (2013.01);
(Continued)

(58) Field of Classification Search
CPC .... H10N 30/08; H10N 30/302; H10N 30/306; H10N 30/87; B81B 3/0018;
(Continued)

(56) References Cited

U.S. PATENT DOCUMENTS

| 6,657,517 B2 | 12/2003 | Barber |
| 6,857,501 B1 | 2/2005 | Han |

(Continued)

FOREIGN PATENT DOCUMENTS

| CN | 109495829 A | 3/2019 |
| CN | 110545514 A | 12/2019 |

(Continued)

*Primary Examiner* — Angelica M McKinney
(74) *Attorney, Agent, or Firm* — Knobbe, Martens, Olson & Bear LLP

(57) ABSTRACT

A piezoelectric sensor (e.g., for use in a piezoelectric MEMS microphone) includes a substrate and a cantilever beam attached to the substrate. The cantilever beam has a proximal portion attached to the substrate and extending to an unsupported distal end. An electrode is disposed on or in the proximal portion of the beam and has an outer boundary with a shape substantially corresponding to a contour line of a strain distribution plot for the cantilever beam resulting from a force applied to the cantilever beam.

18 Claims, 16 Drawing Sheets

(51) Int. Cl.
  *B81C 1/00* (2006.01)
  *H04R 3/00* (2006.01)
  *H04R 7/10* (2006.01)
  *H04R 17/02* (2006.01)
  *H10N 30/30* (2023.01)
  *H10N 30/87* (2023.01)

(52) U.S. Cl.
  CPC ............... *H04R 7/10* (2013.01); *H04R 17/02* (2013.01); *H10N 30/302* (2023.02); *H10N 30/306* (2023.02); *H10N 30/87* (2023.02); *B81B 2201/0257* (2013.01); *B81B 2203/0118* (2013.01); *B81B 2203/0307* (2013.01); *B81B 2203/04* (2013.01); *B81B 2207/01* (2013.01); *H04R 2201/003* (2013.01)

(58) Field of Classification Search
  CPC ..... B81B 2201/0257; B81B 2203/0118; B81B 2203/0307; B81B 2203/04; B81B 2207/01; B81C 1/0015; H04R 3/005; H04R 7/10; H04R 17/02; H04R 2201/003; H04R 2410/00; H04R 17/00; H04R 31/006; H04R 31/003
  See application file for complete search history.

(56) References Cited

U.S. PATENT DOCUMENTS

| | | | |
|---|---|---|---|
| 8,466,606 B2 | 6/2013 | Chen | |
| 8,531,088 B2 | 9/2013 | Grosh | |
| 8,582,788 B2 | 11/2013 | Leidl et al. | |
| 9,029,963 B2 | 5/2015 | Sparks et al. | |
| 9,055,372 B2 | 6/2015 | Grosh | |
| 9,099,640 B2 * | 8/2015 | Takano | H10N 30/2023 |
| 9,386,379 B2 | 7/2016 | Sparks | |
| 9,479,875 B2 | 10/2016 | Hall | |
| 9,516,421 B1 | 12/2016 | Loeppert | |
| 9,853,201 B2 | 12/2017 | Grosh et al. | |
| 10,001,391 B1 | 6/2018 | Littrell | |
| 10,170,685 B2 | 1/2019 | Grosh et al. | |
| 10,356,531 B2 | 7/2019 | Giusti et al. | |
| 10,825,982 B1 | 11/2020 | Littrell et al. | |
| 11,099,078 B1 | 8/2021 | Littrell | |
| 11,350,219 B2 | 5/2022 | Hui et al. | |
| 11,553,280 B2 | 1/2023 | Hui et al. | |
| 2006/0230835 A1 | 10/2006 | Wang | |
| 2009/0116662 A1 | 5/2009 | Wu | |
| 2009/0301196 A1 | 12/2009 | Wang | |
| 2011/0124124 A1 | 5/2011 | Shih | |
| 2012/0293043 A1* | 11/2012 | Takano | H10N 30/87 310/323.02 |
| 2015/0255308 A1 | 9/2015 | Lin | |
| 2015/0266717 A1 | 9/2015 | Okamoto | |
| 2015/0271606 A1* | 9/2015 | Grosh | H04R 31/003 216/13 |
| 2016/0249122 A1 | 8/2016 | Popper | |
| 2016/0258824 A1 | 9/2016 | Fuji | |
| 2017/0318385 A1 | 11/2017 | Harney | |
| 2018/0077497 A1 | 3/2018 | Hatipoglu | |
| 2018/0138391 A1 | 5/2018 | Gros | |
| 2018/0186623 A1 | 7/2018 | Vossough | |
| 2019/0177155 A1 | 6/2019 | Qian | |
| 2019/0289405 A1* | 9/2019 | Littrell | H04R 3/007 |
| 2020/0148532 A1 | 5/2020 | Grosh et al. | |
| 2021/0051413 A1 | 2/2021 | Hui et al. | |
| 2021/0120346 A1 | 4/2021 | Hui et al. | |
| 2021/0367135 A1* | 11/2021 | Feng | H10N 30/302 |
| 2022/0166403 A1 | 5/2022 | Doll | |
| 2022/0264229 A1* | 8/2022 | Yao | H10N 30/302 |
| 2022/0408185 A1 | 12/2022 | Barsukou | |
| 2022/0408208 A1* | 12/2022 | Chen | H10N 30/306 |
| 2023/0130082 A1* | 4/2023 | Qian | H04R 31/006 310/328 |

FOREIGN PATENT DOCUMENTS

| | | |
|---|---|---|
| JP | 2010232971 A | 10/2010 |
| JP | 2018 137297 A | 8/2018 |
| KR | 10-1545271 | 8/2015 |
| TW | I727164 B | 5/2021 |
| WO | WO 2017/200219 A1 | 11/2017 |

* cited by examiner

PIEZOELECTRIC SENSOR WITH INCREASED SENSITIVITY AND DEVICES HAVING THE SAME

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

The present disclosure is directed to piezoelectric sensors for use with devices, such as piezoelectric microelectromechanical systems (MEMS) microphones, and in particular to piezoelectric sensors with increased sensitivity.

Description of the Related Art

A MEMS microphone is a micro-machined electromechanical device used to convert sound pressure (e.g., voice sound) to an electrical signal (e.g., voltage). MEMS microphones are widely used in mobile devices, headsets, smart speakers and other voice-interface devices or systems. Conventional capacitive MEMS microphones suffer from high power consumption (e.g., large bias voltage) and reliability, for example when used in a harsh environment (e.g., when exposed to dust and/or water).

Piezoelectric MEMS microphones have been used to address the deficiencies of capacitive MEMS microphones. Piezoelectric MEMS microphones offer a constant listening capability while consuming almost no power (e.g., no bias voltage is needed), are robust and immune to water and dust contamination. Existing piezoelectric MEMS microphones include cantilever MEMS structures, and are mostly based on sputter-deposited thin film piezoelectric structure. Piezoelectric MEMS microphones use piezoelectric sensors to convert acoustic pressure into electrical signals

SUMMARY

Accordingly, there is a need for a piezoelectric sensor with increased sensitivity.

In accordance with one aspect of the disclosure, a piezoelectric sensor includes a cantilevered beam and an electrode having an outer boundary that corresponds to a contour line of a strain distribution plot for the beam to which a force has been applied.

In accordance with one aspect of the disclosure, there is a need for an acoustic device with piezoelectric sensors with increased sensitivity, for example, a piezoelectric MEMS microphone with higher output energy than existing MEMS microphones.

In accordance with one aspect of the disclosure, a piezoelectric sensor comprises a substrate and a cantilever beam having a proximal portion attached to the substrate and extending to an unsupported distal end of the beam. An electrode is disposed on or in the proximal portion of the beam, the electrode having an outer boundary with a shape substantially corresponding to a contour line of a strain distribution plot for the cantilever beam resulting from a force applied to the cantilever beam.

In accordance with another aspect of the disclosure a piezoelectric microelectromechanical systems microphone is provided. The MEMS microphone includes a substrate and a plurality of piezoelectric sensors movably coupled to the substrate. Each of the piezoelectric sensors are spaced apart from an adjacent piezoelectric sensor by a gap and include: a cantilever beam having a proximal portion attached to the substrate and extending to an unsupported distal end of the beam, and an electrode disposed on or in the proximal portion of the beam, the electrode having an outer boundary with a shape substantially corresponding to a contour line of a strain distribution plot for the cantilever beam resulting from a force applied to the cantilever beam. The plurality of piezoelectric sensors are configured to deflect when subjected to sound pressure.

In accordance with another aspect of the disclosure, an audio system is provided comprising an audio codec and one or more piezoelectric microelectromechanical systems microphones in communication with the audio codec. Each microphone includes: a substrate and a plurality of piezoelectric sensors movably coupled to the substrate, each of the piezoelectric sensors spaced apart from an adjacent piezoelectric sensor by a gap and including a cantilever beam having a proximal portion attached to the substrate and extending to an unsupported distal end of the beam, and an electrode disposed on or in the proximal portion of the beam, the electrode having an outer boundary with a shape substantially corresponding to a contour line of a strain distribution plot for the cantilever beam resulting from a force applied to the cantilever beam.

In accordance with another aspect of the disclosure, an electronic device comprises a processor and an audio subsystem that communicates with the processor. The audio subsystem comprises one or more piezoelectric microelectromechanical systems microphones mounted on a substrate layer. Each microphone includes: a substrate and a plurality of piezoelectric sensors movably coupled to the substrate, each of the piezoelectric sensors spaced apart from an adjacent piezoelectric sensor by a gap and including a cantilever beam having a proximal portion attached to the substrate and extending to an unsupported distal end of the beam, and an electrode disposed on or in the proximal portion of the beam, the electrode having an outer boundary with a shape substantially corresponding to a contour line of a strain distribution plot for the cantilever beam resulting from a force applied to the cantilever beam.

In accordance with another aspect of the disclosure, a method of making a piezoelectric sensor is provided. The method includes forming or depositing one or more piezoelectric layers to define a beam extending between a proximal portion and a distal end. The method also includes modeling a strain distribution on the beam based on a force applied to the beam, defining an outer boundary with a shape substantially corresponding to a contour line of the strain distribution on the beam, forming or providing an electrode having said outer boundary shape, and attaching the electrode to the beam. The method also comprises attaching the beam to a substrate in cantilever form so that the proximal portion of the beam is anchored to the substrate and the distal end of the beam is unsupported.

In accordance with another aspect of the disclosure, a method of making a microphone module is provided. The method includes forming or providing a printed circuit board that includes a substrate layer. The method also includes forming or providing a piezoelectric microelectromechanical systems microphone via a process comprising (a) forming one or more cantilever piezoelectric sensors including forming or depositing one or more piezoelectric layers to define a beam extending between a proximal portion and a distal end, (b) modeling a strain distribution on the beam based on a force applied to the beam, (c) defining an outer boundary with a shape substantially corresponding to a contour line of the strain distribution on the beam, (d) forming or providing an electrode having said outer boundary shape, (e) attaching the electrode to the beam, and (f) attaching the beam to a substrate in cantilever form so that the proximal portion of the beam is anchored to the substrate and the distal end of the beam is unsupported. The method also includes mounting the one or more piezoelectric microelectromechanical systems microphones on the printed circuit board.

DETAILED DESCRIPTION

Figure 1A:
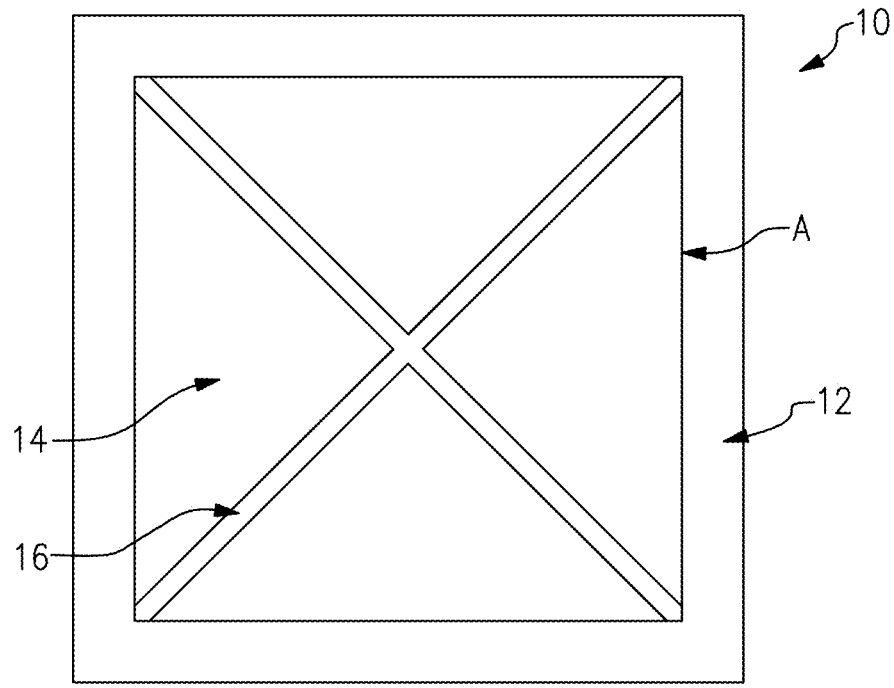
FIG. 1A is a schematic top view of a substrate and sensors for a conventional piezoelectric MEMS microphone.

The following detailed description of certain embodiments presents various descriptions of specific embodiments. However, the innovations described herein can be embodied in a multitude of different ways, for example, as defined and covered by the claims. In this description, reference is made to the drawings were like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Piezoelectric MEMS Microphone

Figure 1B:
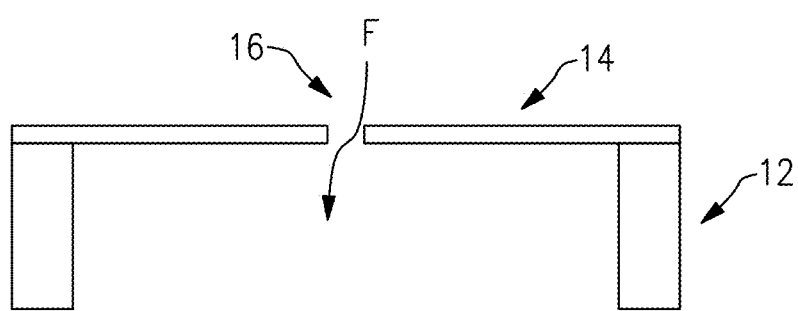
FIG. 1B is a schematic side view of the substrate and sensors for the piezoelectric MEMS microphone of FIG. 1A.

FIGS. 1A-1B show a conventional piezoelectric microelectromechanical systems (MEMS) microphone 10 (hereinafter the "microphone"). The microphone 10 has a substrate 12. The substrate 12 is optionally made of Silicon and may optionally have additional dielectric, metallic or semiconductor films deposited on it. The microphone 10 can have one or more piezoelectric sensors 14 (hereinafter "sensors") anchored to the substrate 12 in cantilever form with a gap 16 between adjacent sensors 14. The microphone 10 converts an acoustic signal to an electrical signal when a sound wave vibrates the sensors 14. The sensors 14 can be made from one or more layers of material. Optionally, the sensors 14 can be made at least in part of Aluminum Nitride (AlN). In another implementation, the sensors 14 can optionally be made at least in part of Scandium Aluminum Nitride (ScAlN) or other piezoelectric materials. The sensors 14 can include an electrode, which can optionally be made of molybdenum (Mo), titanium nitride (TiN), platinum (Pt) or ruthenium (Ru), in some implementations. The gaps 16 between the sensors 14 allow the sensors 14 to freely move, for airflow F to pass therethrough, and balance the pressure between both sides of the sensors 14. The gap 16 can be about 100-500 nm wide. The sensors 14 are preferably planar (e.g., flat), but are generally not completely flat due to a material internal stress gradient in the sensors 14.

Piezoelectric Sensors with Increased Sensitivity

With reference to FIGS. 1C-6D, the inventors have developed a piezoelectric sensor with increased sensitivity and output energy, and a method for designing such piezoelectric sensors. Though some of the implementations described herein describe such piezoelectric sensors as used in a piezoelectric MEMS microphone, the improved piezoelectric sensor can be used in various other applications, such as in energy harvesting (e.g., generation of voltage and storage of energy from the movement of the sensor). The improved piezoelectric sensor can also be used as an ultrasonic transducer, an accelerometer, an optical sensor.

Figure 1C:
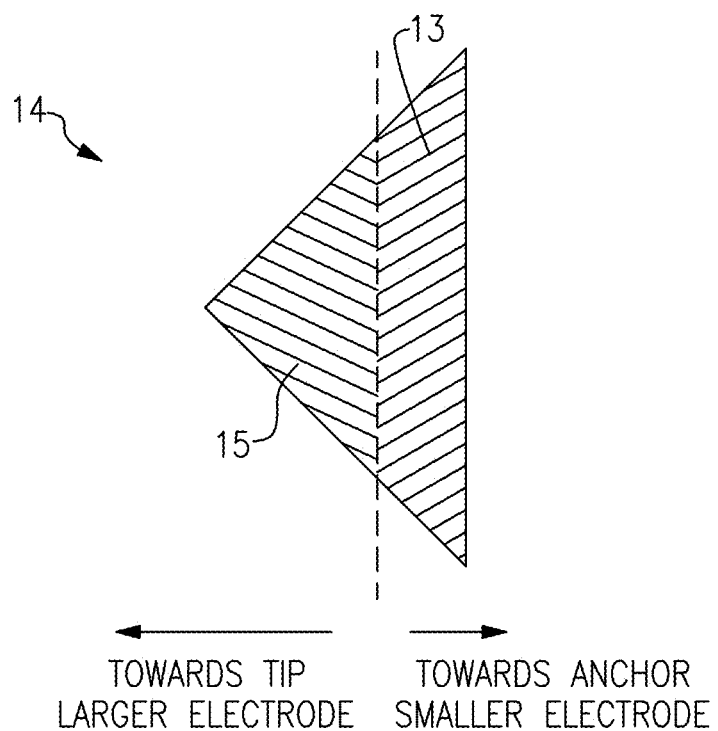
FIG. 1C is a schematic top plan view of a piezoelectric sensor.

FIG. 1C shows a piezoelectric sensor 14 with an electrode 13 and beam 15 (cantilever beam), the electrode 13 disposed on a proximal portion (e.g., proximate the anchor end) of the beam 15. How much of the beam 15 the electrode 13 covers is determined based on a balance between capacitance and voltage that result in energy output by the electrode 13 (based on the relationship $E \propto CV^2$, where E is energy, C is capacitance and V is voltage). If maximum energy is required from the electrode 13, the smaller the electrode 13 is (e.g., the less it extends away from the anchor or proximal end of the beam 15), the higher the average stress/strain and voltage V it has and the smaller the capacitance C of the electrode 13. Similarly, the larger the electrode 13 is (e.g., the farther it extends away from the anchor or proximal end and toward the distal tip of the beam 15), the larger the capacitance C of the electrode 13 and the lower the voltage V. The electric energy provided by the sensor 14 is generated by the stress or strain in the sensing area (e.g., electrode 13) of the sensor 14.

Figure 1D:
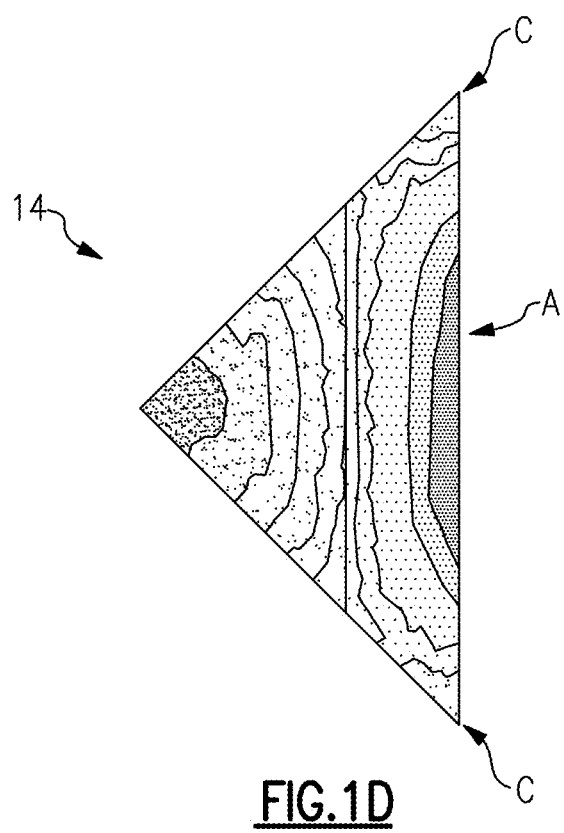
FIG. 1D is a plot of strain distribution with acoustic pressure applied to the piezoelectric sensor in FIG. 1C.

FIG. 1D is a plot of strain distribution due to an acoustic pressure force acting on the sensor 14. As can be seen from the plot, the high strain region of the sensor 14 is concentrated close to the proximal or anchor end A of the sensor 14. Further the proximal corners C of the sensor 14 do not experience high strain, so covering these corners with the electrode 13 is not efficient use of the electrode area. The inventors have recognized that enlarging the portion of the high strain region of the beam 15 that is covered by the electrode 13 (e.g., by decreasing the portion of the low strain region that is covered by the electrode 13) would increase the performance of the sensor 14.

Figure 1E:
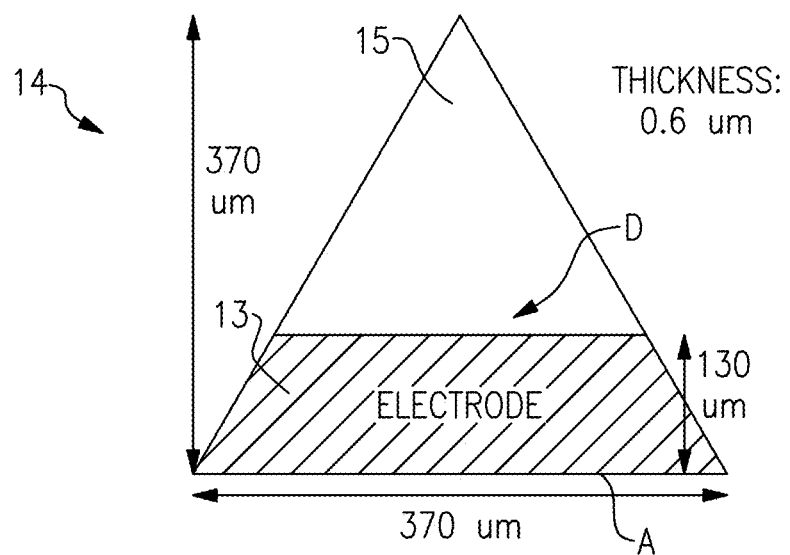
FIG. 1E is a schematic top plan view of the piezoelectric sensor of FIG. 1C.

FIG. 1E shows the electrode 14 with a beam 15 (e.g., cantilever beam) and an electrode 13 that covers a proximal portion of the beam 15 (e.g., proximate or adjacent the anchor end A of the beam 15). In one implementation, the beam 15 can be triangular and the electrode 13 can have a trapezoid shape. The beam 15 can have a length of 370 um and width of 370 um at the anchor end A. The electrode 13 can have a height of 130 um between the anchor end A and the distal edge D of the electrode 13. The sensor 14 can have a voltage output of about 7.41 uV.

Figure 2A:
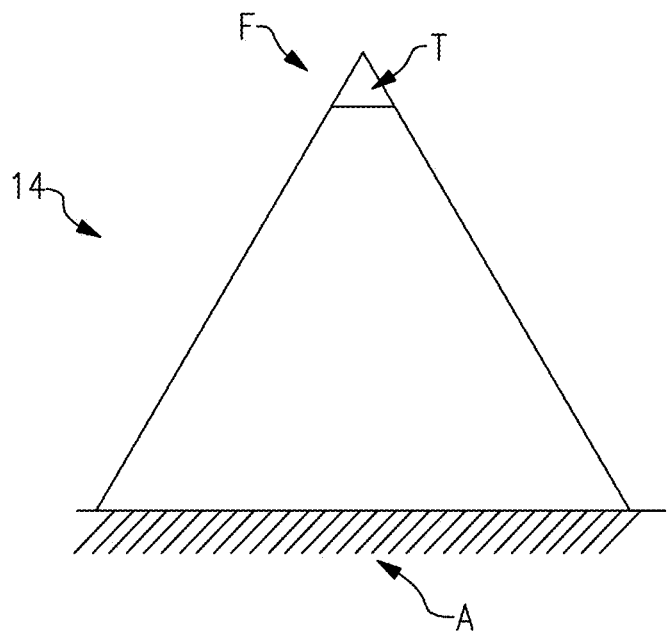
FIG. 2A is a schematic top plan view of the piezoelectric sensor of FIG. 1C showing application of a force thereon.
Figure 2B:
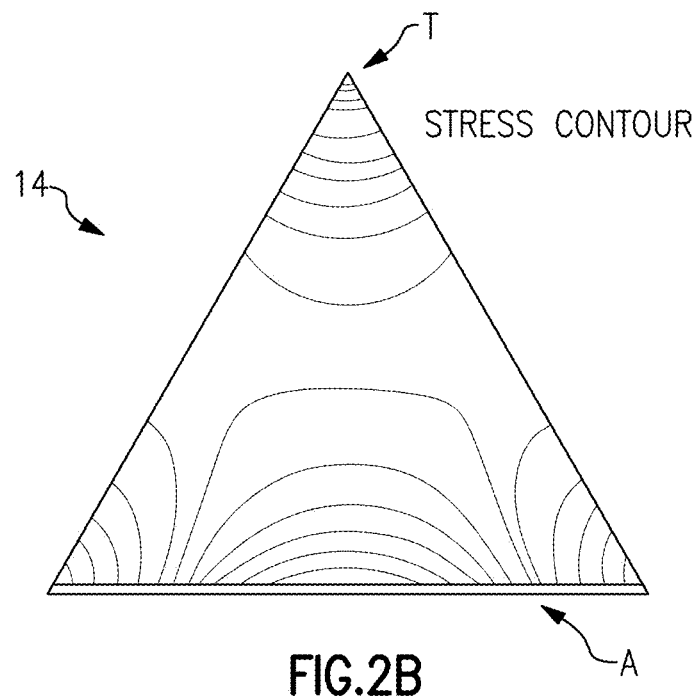
FIG. 2B is a plot of strain distribution with acoustic pressure for the piezoelectric sensor in FIG. 2A.
Figure 2C:
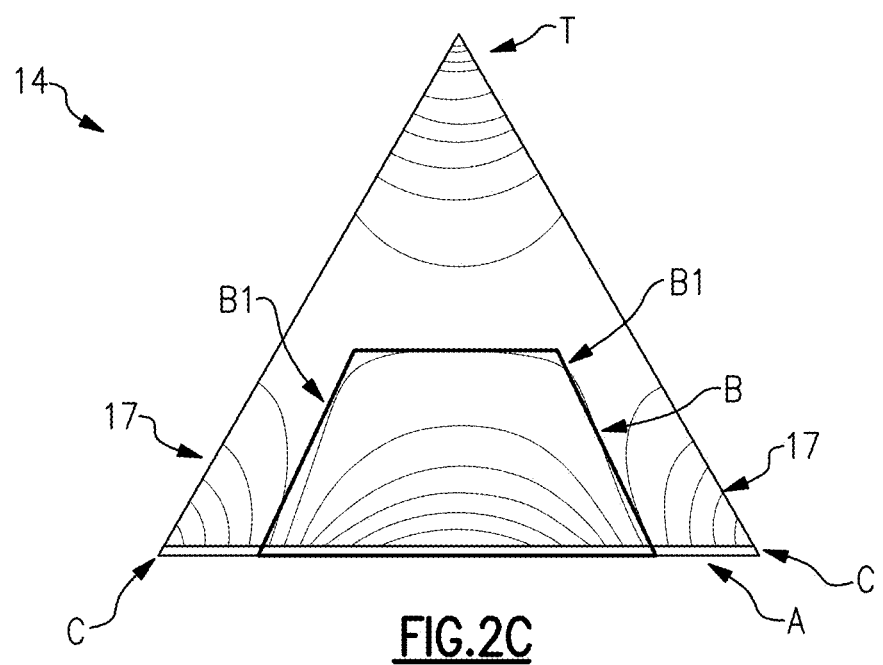
FIG. 2C is a schematic of the electrode sensor with strain distribution plot of FIG. 2B with an electrode shape boundary following contour lines of the strain distribution plot.

FIG. 2A shows a force F applied to a tip T of the sensor 14, where the proximal or anchor end A of the sensor 14 is fixed. FIG. 2B shows a strain distribution plot for the sensor in FIG. 2A. FIG. 2C shows a boundary B that substantially follows or corresponds to a contour line of the strain distribution that coincides with a size of the electrode 13 in FIG. 1E. The boundary B has a trapezoidal shape with side edges B1 that are disposed inward of outer edges 17 of the beam 15. Advantageously, the boundary B does not include the corners C of the anchor end A of the sensor 14.

Figure 3:
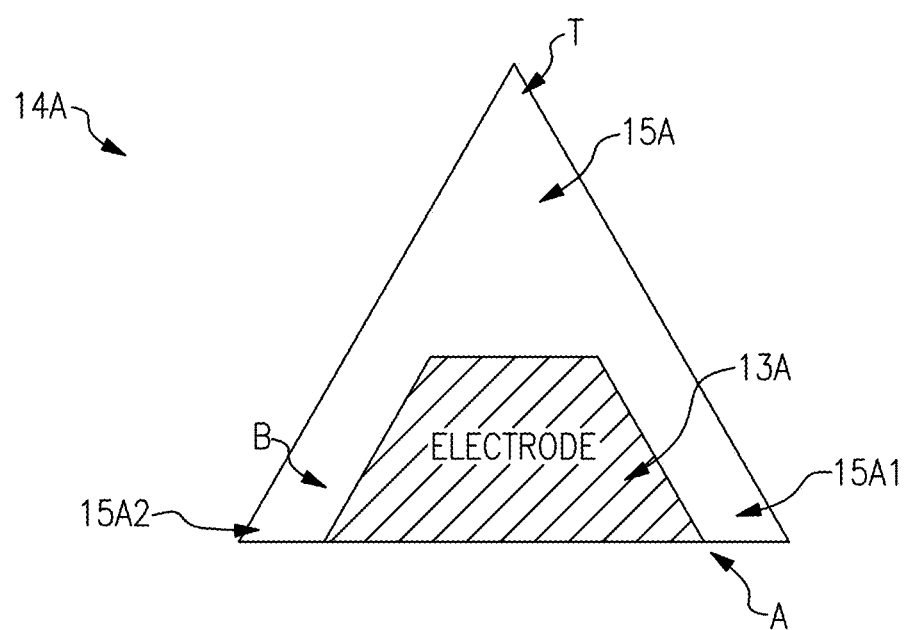
FIG. 3 is a schematic top plan view of a piezoelectric sensor with the electrode shape in FIG. 2C.

FIG. 3 is a piezoelectric sensor 14A with a beam 15A and electrode 13A having the boundary B of FIG. 2C, where the electrode or sensing area 13A does not extend over the corners 15A1, 15A2 of the beam 15A proximate the anchor A. The beam 15A has the same size as the beam 15 in FIG. 1E. The electrode 13A with the boundary B has a voltage output of 7.88 uV and a 0.5 dB increase in sensitivity. The electrode 13A has the same (sensing) area as the electrode 13 in FIG. 1E, but it is distributed over more of the high strain region of the sensor 14A. Accordingly, the electrode 13A achieves an increase in voltage output and sensitivity for the same size as the electrode 13 by designing the electrode 13A to have a boundary B that follows a contour line that surrounds more of the high strain region of the sensor 14A.

Figure 4A:
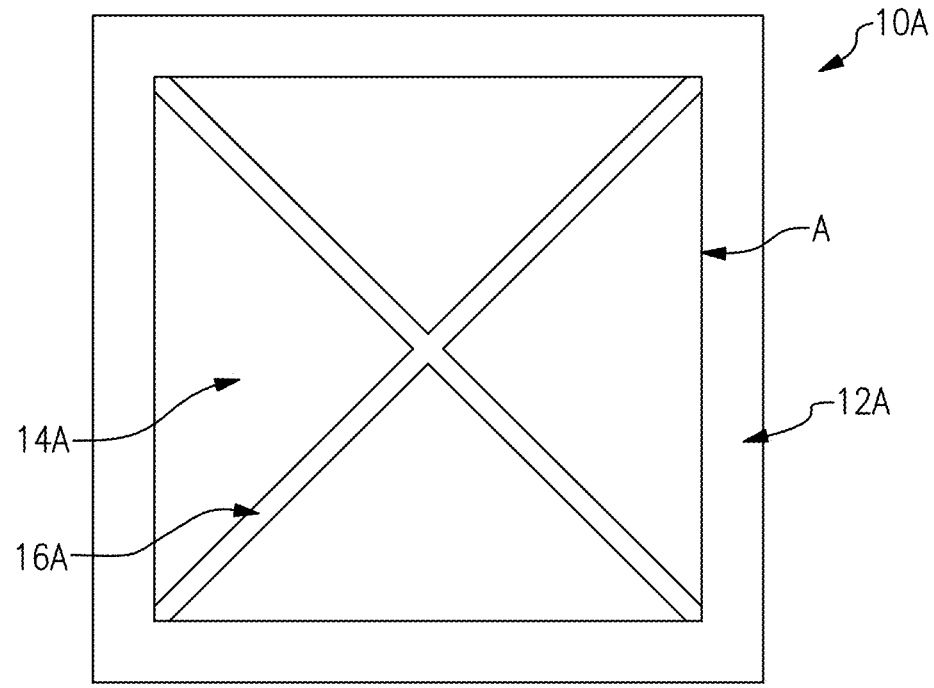
FIG. 4A is a schematic top view of a substrate and sensors for a piezoelectric MEMS microphone incorporating the piezoelectric sensor of FIG. 3.
Figure 4B:
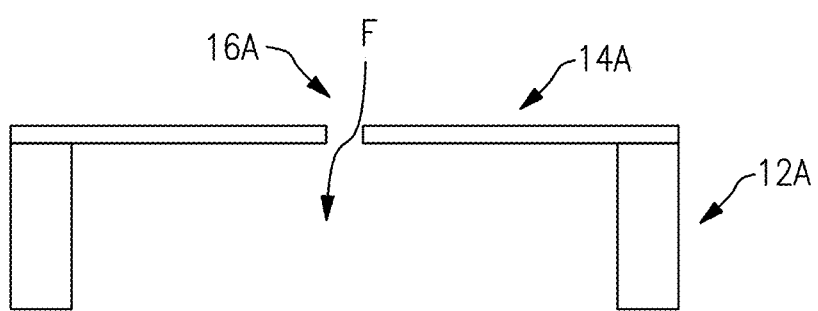
FIG. 4B is a schematic side view of the substrate and sensors for the piezoelectric MEMS microphone of FIG. 4A.

FIGS. 4A-4B show a piezoelectric microelectromechanical systems (MEMS) microphone 10A. The microphone 10A has a substrate 12A. The substrate 12A is optionally made of Silicon and may optionally have additional dielectric, metallic or semiconductor films deposited on it. The microphone 10A can have one or more piezoelectric sensors 14A (hereinafter "sensors") anchored to the substrate 12A in cantilever form with a gap 16A between adjacent sensors 14A. The microphone 10A converts an acoustic signal to an electrical signal when a sound wave vibrates the sensors 14A. The sensors 14A can be made from one or more layers of material. Optionally, the sensors 14 can be made at least in part of Aluminum Nitride (AlN). In another implementation, the sensors 14A can optionally be made at least in part of Scandium Aluminum Nitride (ScAlN) or other piezoelectric materials. The sensors 14A can include an electrode, which can optionally be made of molybdenum (Mo), titanium nitride (TiN), platinum (Pt) or ruthenium (Ru), in some implementations. The gaps 16A between the sensors 14A allow the sensors 14A to freely move, for airflow F to pass therethrough, and balance the pressure between both sides of the sensors 14A. The gap 16A can be about 100-500 nm wide. The sensors 14A are preferably planar (e.g., flat), but are generally not completely flat due to a material internal stress gradient in the sensors 14A. The sensors 14A have the electrode 13A (e.g., with shape) illustrated and described above for FIG. 3.

Figure 5A:
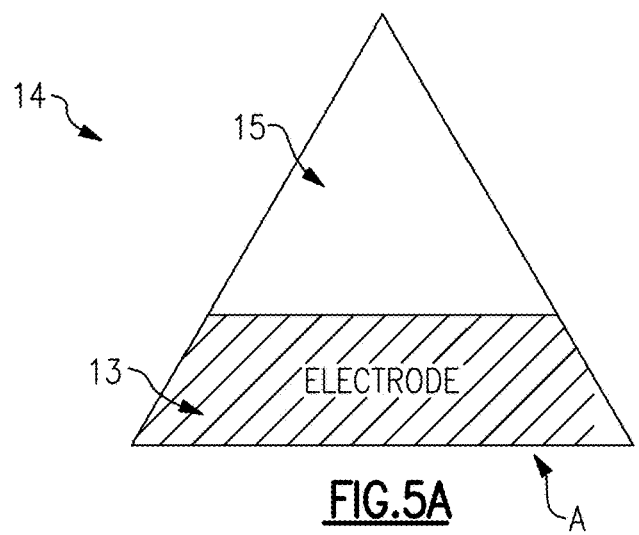
FIG. 5A is a schematic top plan view of a piezoelectric sensor.

FIG. 5A shows the electrode 14 with a beam 15 (e.g., cantilever beam) and an electrode 13 that covers a proximal portion of the beam 15 (e.g., proximate or adjacent the anchor end A of the beam 15). In one implementation, the beam 15 can be triangular and the electrode 13 can have a trapezoid shape that covers the proximal portion of the beam 15 proximate (e.g., adjacent) the anchor end A. The electrode 14 in FIG. 5A can be similar (e.g. identical in shape, dimensions, materials, etc.) to the electrode 14 in FIG. 1E.

Figure 5B:
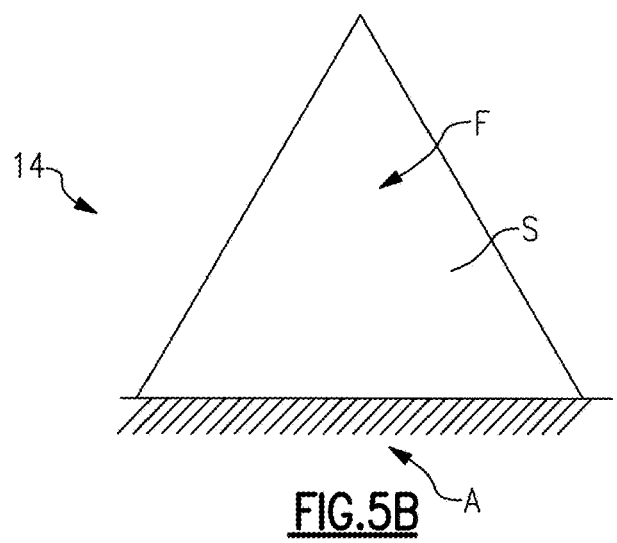
FIG. 5B shows the piezoelectric sensor of FIG. 5A with a force applied thereon.
Figure 5C:
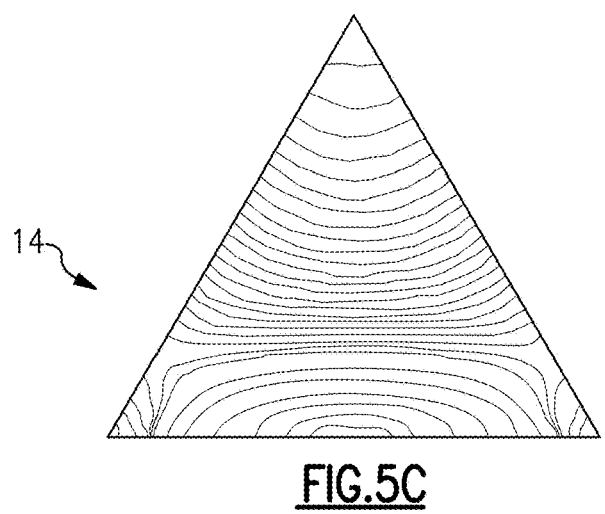
FIG. 5C is a schematic of the piezoelectric sensor of FIG. 5B with a strain distribution plot from the force of FIG. 5B applied thereon.
Figure 5D:
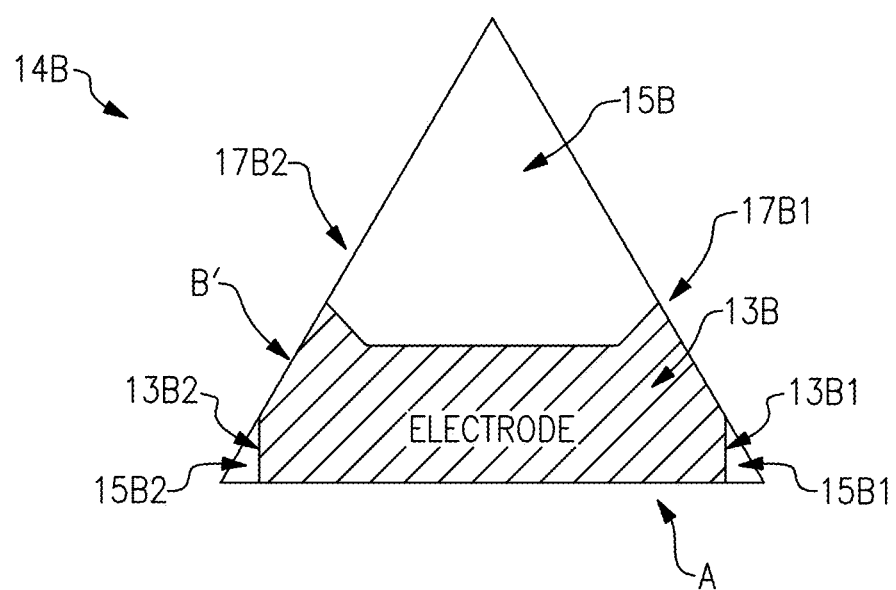
FIG. 5D is a schematic top plan view of a piezoelectric sensor with an electrode shape following contour lines of the strain distribution plot FIG. 5C.

FIG. 5B shows a force F applied over an entire surface S of the sensor 14, where the proximal or anchor end A of the sensor 14 is fixed. FIG. 5C shows a strain distribution plot for the sensor 14 in FIG. 5B. FIG. 5D is a piezoelectric sensor 14B with a beam 15B and electrode 13B having the boundary B' that approximates or corresponds to a contour line of the strain distribution that coincides with a size of the electrode 13 in FIG. 5A. The boundary B' has side edges 13B1, 13B2 that are disposed inward of outer edges 17B1, 17B2 of the beam 15B. Advantageously, the boundary B' of the electrode or sensing area 13B does not extend over the corners 15B1, 15B2 of the beam 15B proximate the anchor A. The beam 15B has the same size as the beam 15 in FIG. 5A. The electrode 13B has the same (sensing) area as the electrode 13 in FIG. 5A, but it is distributed over more of the high strain region of the sensor 14B. Accordingly, the electrode 13B achieves an increase in voltage output and sensitivity for the same size as the electrode 13 by designing the electrode 13B to have a boundary B' that follows a contour line that surrounds more of the high strain region of the sensor 14B.

Figure 6A:
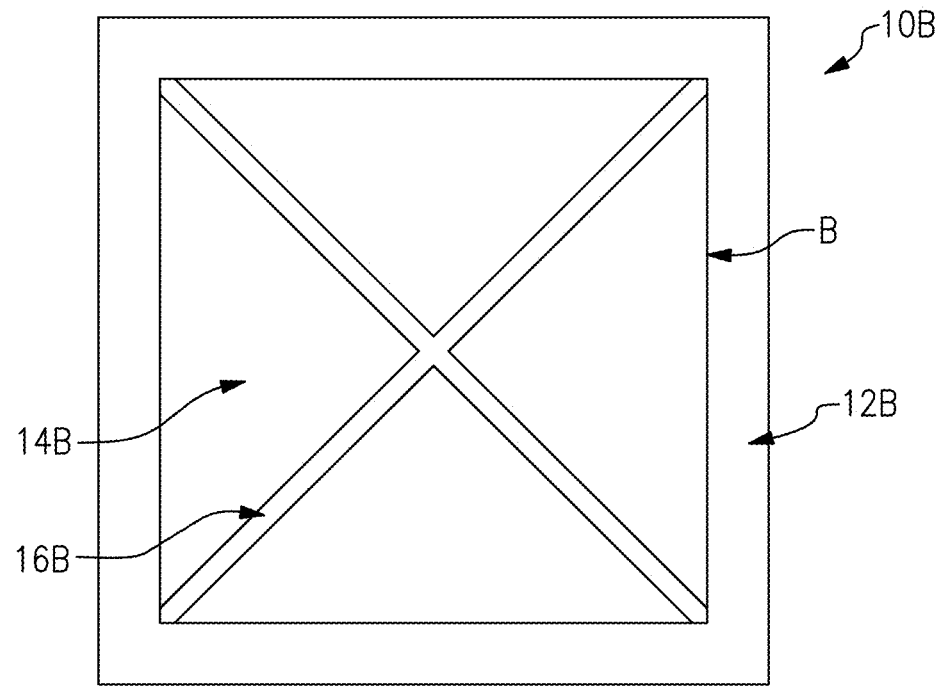
FIG. 6A is a schematic top view of a substrate and sensors for a piezoelectric MEMS microphone incorporating the piezoelectric sensor of FIG. 5D.
Figure 6B:
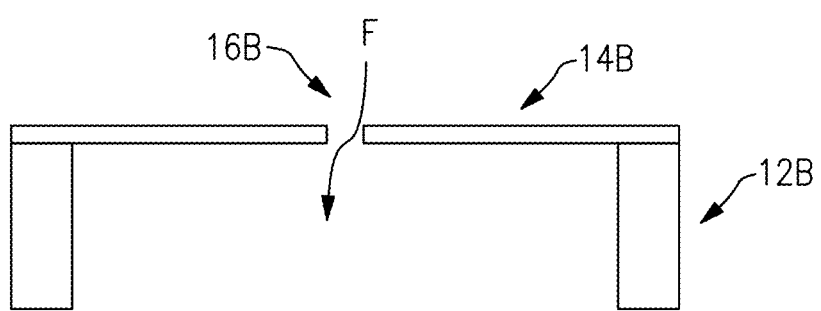
FIG. 6B is a schematic side view of the substrate and sensors for the piezoelectric MEMS microphone of FIG. 6A.

FIGS. 6A-6B show a piezoelectric microelectromechanical systems (MEMS) microphone 10B. Some of the features of the microphone 10B are similar to features of the microphone 10A in FIGS. 4A-4B. Thus, reference numerals used to designate the various components of the microphone 10B are identical to those used for identifying the corresponding components of the microphone 10A in FIGS. 4A-4B, except that a "B" instead of an "A" has been added to the numerical identifier. Therefore, the structure and description for the various features of the microphone 10A in FIGS. 4A-4B are understood to also apply to the corresponding features of the microphone 10B in FIGS. 6A-6B, except as described below. The microphone 10B differs from the microphone 10A in that sensors 14B (described and illustrated in FIG. 5D) are used instead of sensors 14A.

Figure 7A:
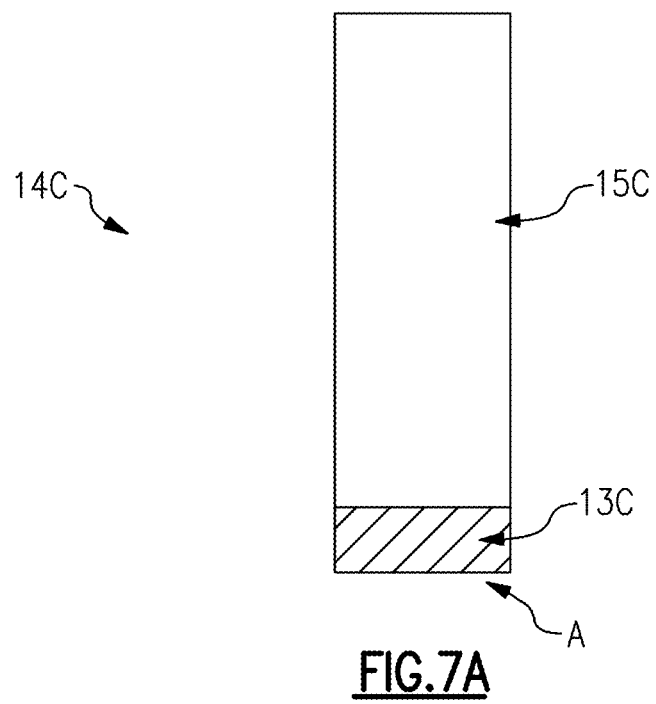
FIG. 7A is a schematic top plan view of an piezoelectric sensor.

FIG. 7A shows the electrode 14C with a beam 15C (e.g., cantilever beam) and an electrode 13C that covers a proximal portion of the beam 15C (e.g., proximate or adjacent the anchor end A of the beam 15C). In one implementation, the beam 15C can be rectangular and the electrode 13 can have a rectangular shape that covers the proximal portion of the beam 15C proximate (e.g., adjacent) the anchor end A.

Figure 7B:
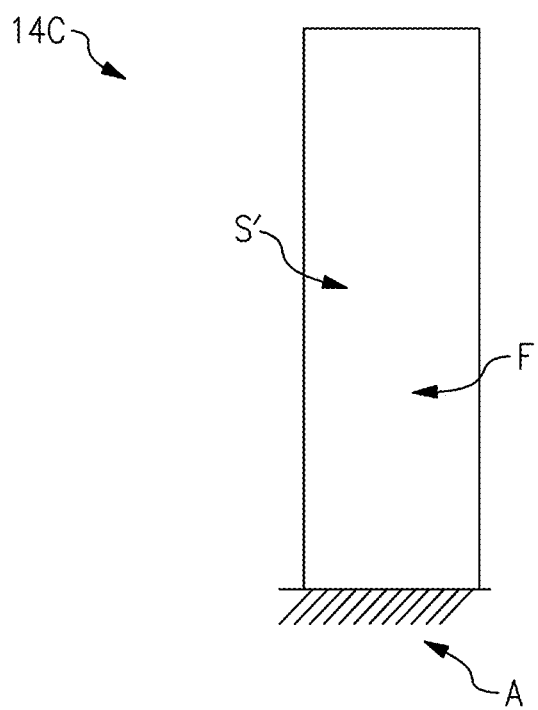
FIG. 7B shows the piezoelectric sensor of FIG. 7A with a force applied thereon.
Figure 7C:
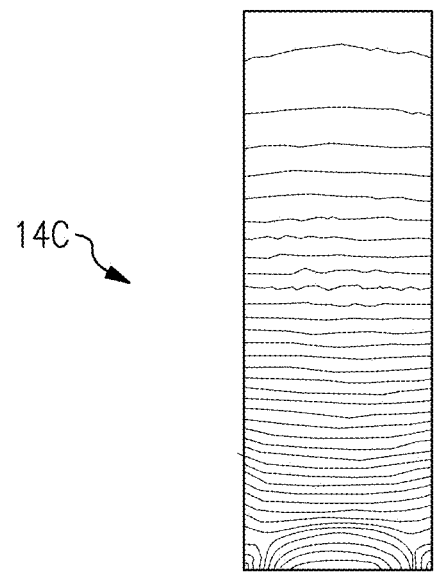
FIG. 7C is a schematic of the piezoelectric sensor of FIG. 7B with a strain distribution plot from the force of FIG. 7B applied thereon.
Figure 7D:
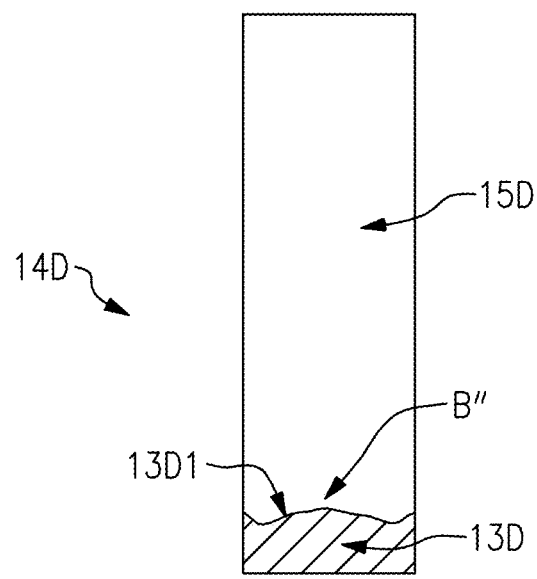
FIG. 7D is a schematic top plan view of a piezoelectric sensor with an electrode shape following contour lines of the strain distribution plot FIG. 7C.

FIG. 7B shows a force F applied over an entire surface S' of the sensor 14C, where the proximal or anchor end A of the sensor 14C is fixed. FIG. 7C shows a strain distribution plot for the sensor 14C in FIG. 7B. FIG. 7D is a piezoelectric sensor 14D with a beam 15D and electrode or sensing area 13D having the boundary B" that substantially follows or corresponds to a contour line of the strain distribution that coincides with a size of the electrode 13C in FIG. 7A. The boundary B" has a contoured or nonlinear edge 13D1. The beam 15D has the same size as the beam 15C in FIG. 7A. The electrode 13D has the same (sensing) area as the electrode 13C in FIG. 7A, but it is distributed over more of the high strain region of the sensor 14D. Accordingly, the electrode 13D achieves an increase in voltage output and sensitivity for the same size as the electrode 13C by designing the electrode 13D to have a boundary B" that follows a contour line that surrounds more of the high strain region of the sensor 14D.

Figure 8A:
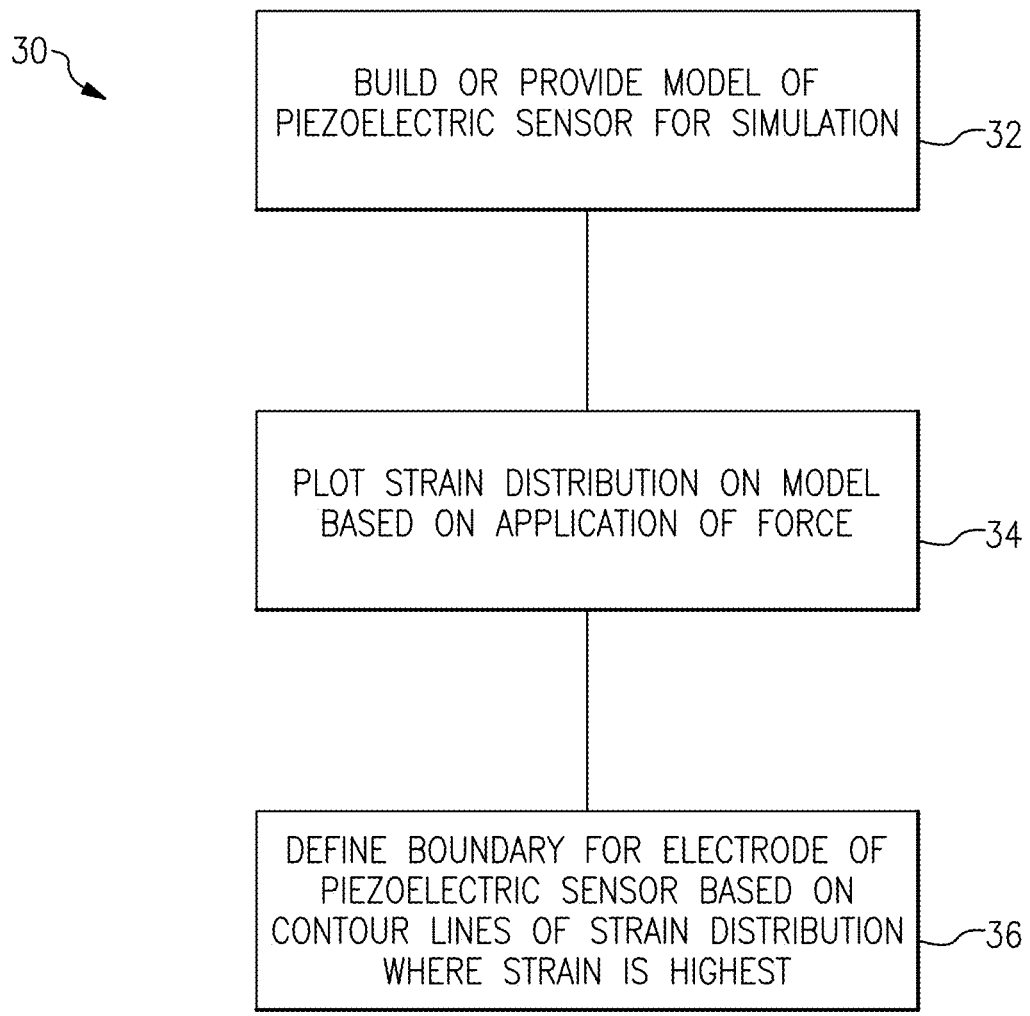
FIG. 8A is a flow diagram of a method of designing a piezoelectric sensor.

FIG. 8A shows a method or process 30 for making or designing a piezoelectric sensor, such as the piezoelectric sensor 14A, 14B, 14D. The method includes the step 32 of building or providing a model of a piezoelectric sensor for simulation. The method includes the step 34 of plotting a strain distribution of the piezoelectric sensor model based on application of a force (e.g., acoustic pressure) thereon. The method also includes the step 36 of defining a boundary of an electrode for the piezoelectric sensor based on a contour line of the strain distribution plot that encompasses (e.g., surrounds) a high strain/stress region of the sensor.

Figure 8B:
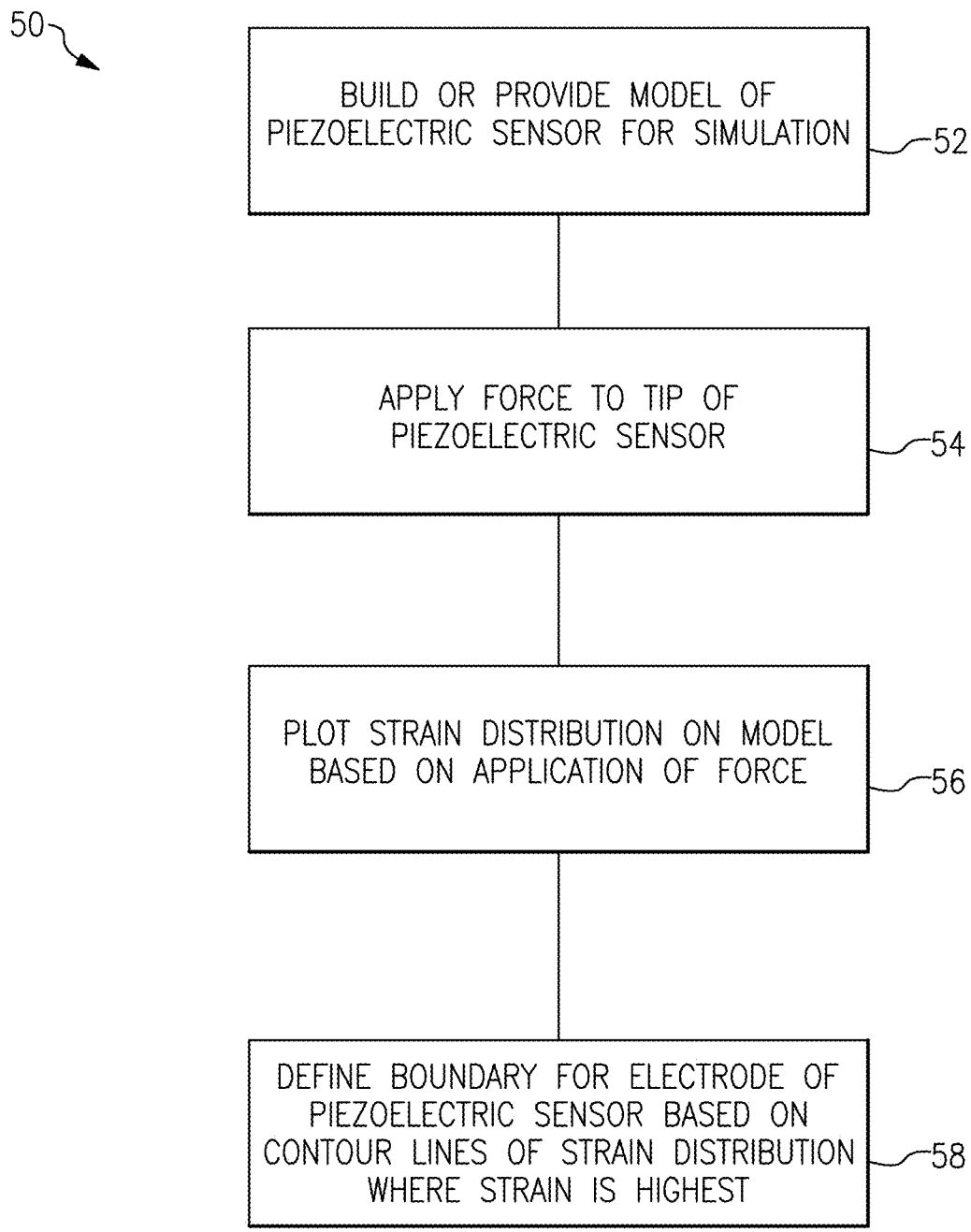
FIG. 8B is a flow diagram of a method of designing a piezoelectric sensor.

FIG. 8B shows a method or process 50 for making or designing a piezoelectric sensor, such as the piezoelectric sensor 14A, 14B, 14D. The method includes the step 52 of building or providing a model of a piezoelectric sensor for simulation. The method includes the step 54 of applying a force (e.g., acoustic pressure) to a tip of the piezoelectric sensor model. The method includes the step 56 of plotting a strain distribution of the piezoelectric sensor model based on application of the force thereon. The method also includes the step 58 of defining a boundary of an electrode for the piezoelectric sensor based on a contour line of the strain distribution plot that encompasses (e.g., surrounds) a high strain/stress region of the sensor.

Figure 8C:
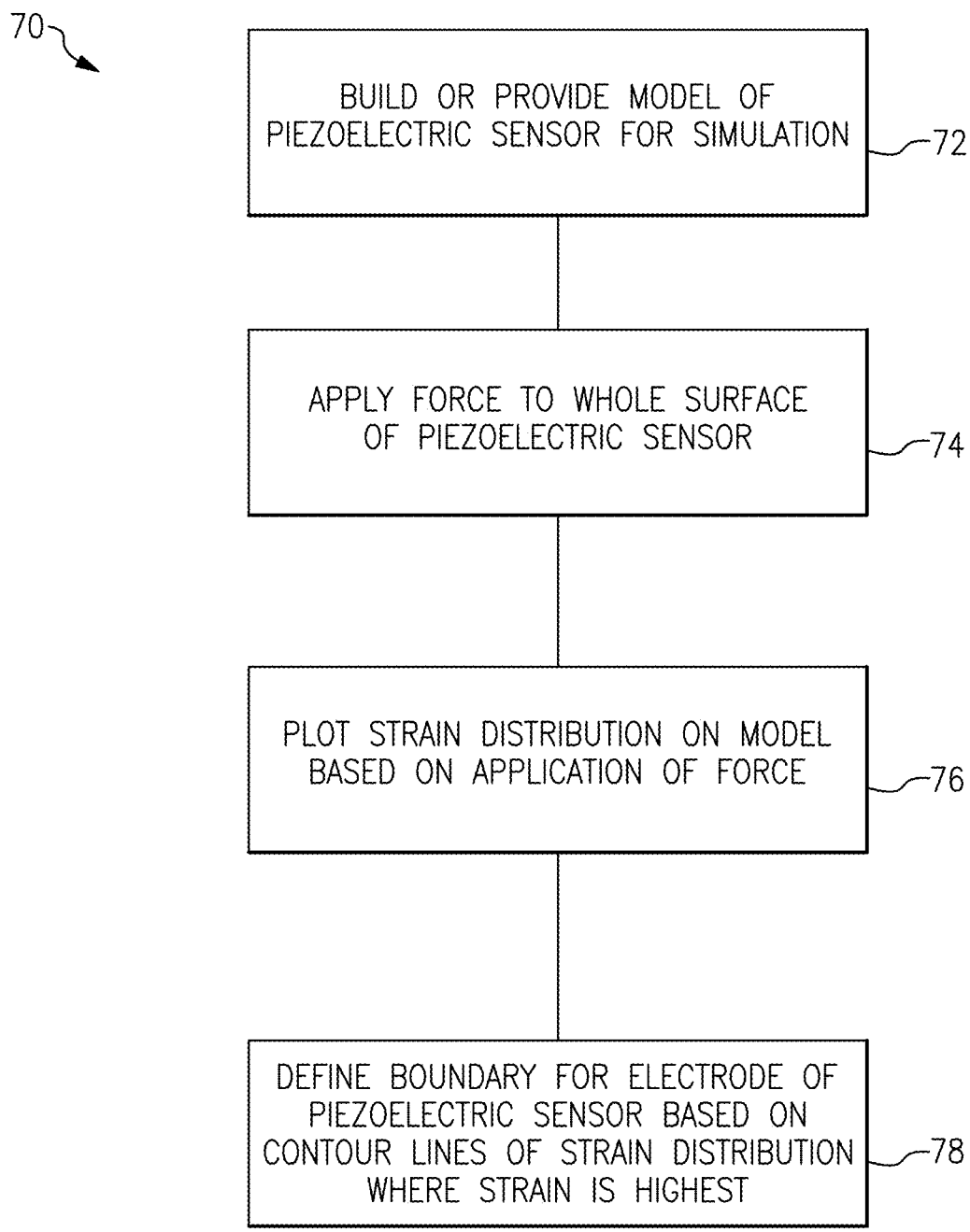
FIG. 8C is a flow diagram of a method of designing a piezoelectric sensor.

FIG. 8C shows a method or process 70 for making or designing a piezoelectric sensor, such as the piezoelectric sensor 14A, 14B, 14D. The method includes the step 72 of building or providing a model of a piezoelectric sensor for simulation. The method includes the step 74 of applying a force (e.g., acoustic pressure) to the whole surface of the piezoelectric sensor model. The method includes the step 76 of plotting a strain distribution of the piezoelectric sensor model based on application of the force thereon. The method also includes the step 78 of defining a boundary of an electrode for the piezoelectric sensor based on a contour line of the strain distribution plot that encompasses (e.g., surrounds) a high strain/stress region of the sensor.

The cantilevered sensors described herein (e.g., cantilevered sensors 14A, 14B, 14D) advantageously provide increased performance (e.g., increased output energy, increased sensitivity) for the same electrode area as conventional cantilevered sensors. The methods 30, 50, 70 in FIGS. 8A-8C can be used to design piezoelectric sensors based on the parameters desired for the sensor (e.g. to maximize energy output from the sensor, to decrease sensitivity of the sensor, etc.).

Figure 9:
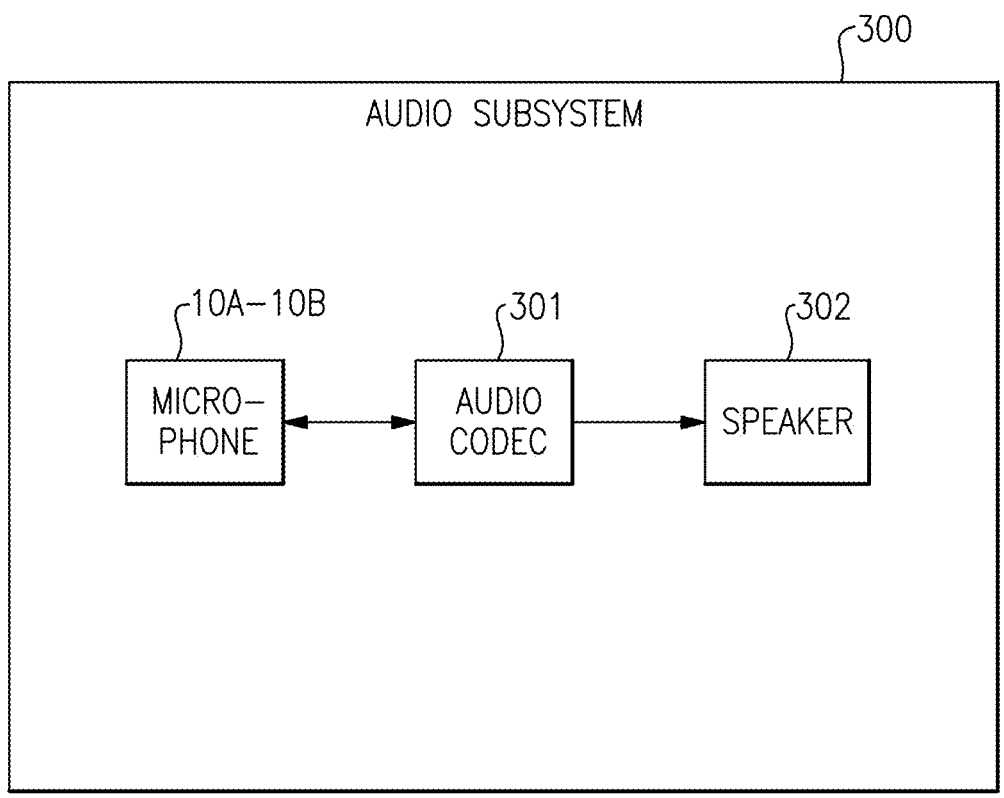
FIG. 9 is a schematic diagram of an audio subsystem.

FIG. 9 is a schematic diagram of an audio subsystem 300. The audio subsystem 300 can include one or more microphones 10A, 10B. In one implementation, at least one of the microphone(s) 10A, 10B is a piezoelectric MEMS microphone. The microphone(s) 10A, 10B can communicate with an audio codec 301, which can control the operation of the microphone(s) 10A. The audio codec 301 can also communicate with a speaker 302 and control the operation of the speaker 302.

Figure 10:
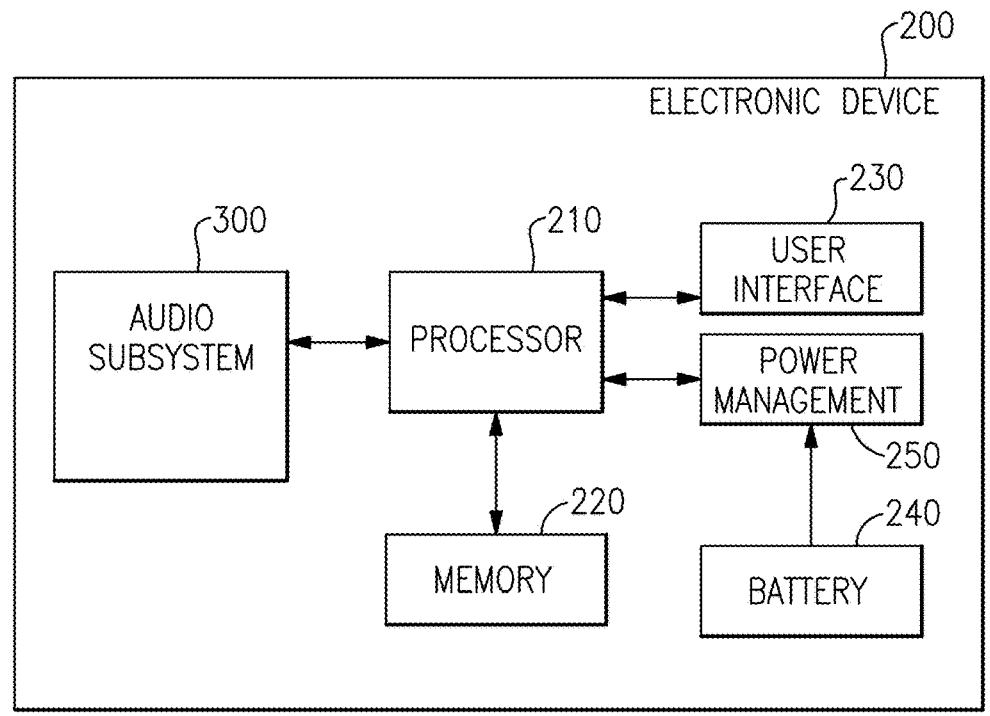
FIG. 10 is a schematic diagram of an electronic device.

FIG. 10 is a schematic diagram of an electronic device 200 that includes the audio subsystem 300. The electronic device 200 can optionally have one or more of a processor 210, a memory 220, a user interface 230, a battery 240 (e.g., direct current (DC) battery) and a power management module 250. Other additional components, such a display and keyboard can optionally be connected to the processor 210. The battery 240 can provide power to the electronic device 200.

It should be noted that, for simplicity, only certain components of the electronic device 200 are illustrated herein. The control signals provided by the processor 210 control the various components within the electronic device 200.

The processor 210 communicates with the user interface 230 to facilitate processing of various user input and output (I/O), such as voice and data. As shown in FIG. 10, the processor 210 communicates with the memory 220 to facilitate operation of the electronic device 200.

The memory 220 can be used for a wide variety of purposes, such as storing data and/or instructions to facilitate the operation of the electronic device 200 and/or to provide storage of user information.

The power management system or module 250 provides a number of power management functions of the electronic device 200. In certain implementations, the power management system 250 includes a PA supply control circuit that controls the supply voltages of power amplifiers. For example, the power management system 250 can change the supply voltage(s) provided to one or more power amplifiers to improve efficiency.

As shown in FIG. 10, the power management system 250 receives a battery voltage from the battery 240. The battery 240 can be any suitable battery for use in the electronic device 200, including, for example, a lithium-ion battery.

Figure 11:
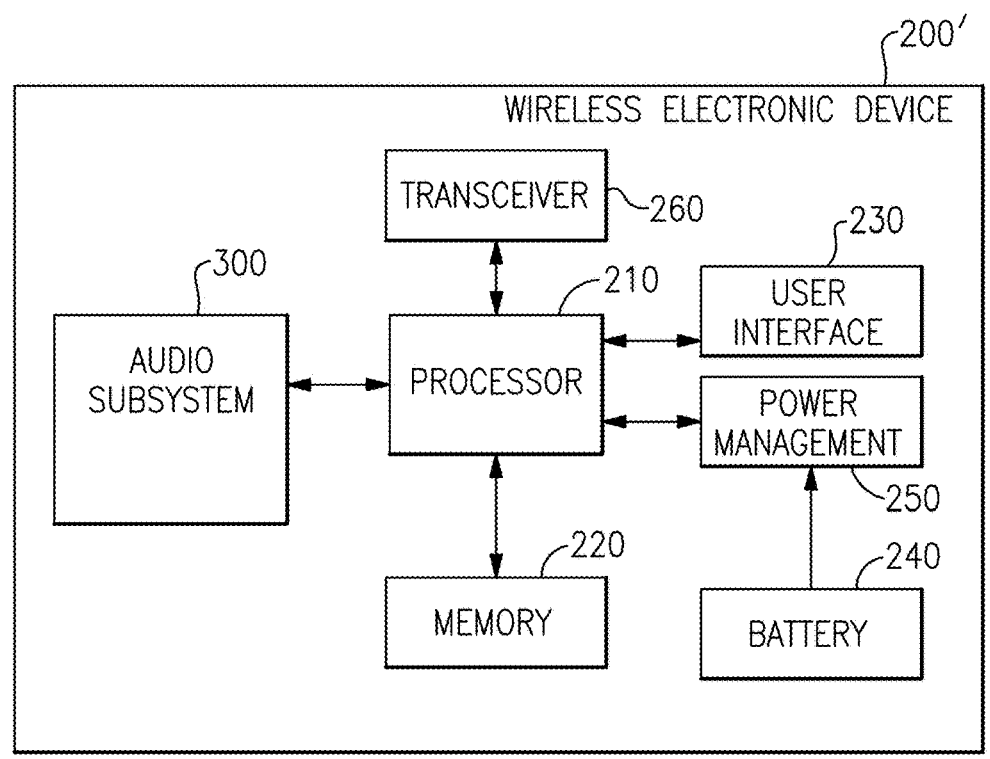
FIG. 11 is a schematic diagram of a wireless electronic device.

FIG. 11 is a schematic diagram of a wireless electronic device 200' The wireless electronic device 200' is similar to the electronic device 200 in FIG. 10. Thus, reference numerals used to designate the various components of the wireless electronic device 200' are identical to those used for identifying the corresponding components of the electronic device 200 in FIG. 10. Therefore, the structure and description above for the various features of the electronic device 200 in FIG. 10 are understood to also apply to the corresponding features of the wireless electronic device 200' in FIG. 11, except as described below.

The wireless electronic device 200' differs from the electronic device 200 in that it also includes a transceiver 260 that communicates (e.g., two-way communication) with the processor 210. Signals, data and/or information received (e.g., wirelessly) by the transceiver 260 (e.g., from a remote electronic device, such a smartphone, tablet computer, etc.) is communicated to the processor 210, and signals, data and/or information provided by the processor is communicated (e.g., wirelessly) by the transceiver 260 (e.g., to a remote electronic device). Further, the function of the transceiver 260 can be integrated into separate transmitter and receiver components.

The wireless electronic device 200' can be used to communicate using a wide variety of communications technologies, including, but not limited to, 2G, 3G, 4G (including LTE, LTE-Advanced, and LTE-Advanced Pro), 5G NR, WLAN (for instance, Wi-Fi), WPAN (for instance, Bluetooth and ZigBee), WMAN (for instance, WiMax), and/or GPS technologies.

The transceiver 260 generates RF signals for transmission and processes incoming RF signals received from antennas. It will be understood that various functionalities associated with the transmission and receiving of RF signals can be achieved by one or more components that are collectively represented in FIG. 11 as the transceiver 260. In one example, separate components (for instance, separate circuits or dies) can be provided for handling certain types of RF signals.

The processor 210 provides the transceiver 260 with digital representations of transmit signals, which the transceiver 260 processes to generate RF signals for transmission. The processor 210 also processes digital representations of received signals provided by the transceiver 260.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the systems and methods described herein may be made without departing from the spirit of the disclosure. The accompanying claims and their equivalents are intended to cover such forms or modifications as would fall within the scope and spirit of the disclosure. Accordingly, the scope of the present inventions is defined only by reference to the appended claims.

Features, materials, characteristics, or groups described in conjunction with a particular aspect, embodiment, or example are to be understood to be applicable to any other aspect, embodiment or example described in this section or elsewhere in this specification unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

Furthermore, certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as a subcombination or variation of a subcombination.

Moreover, while operations may be depicted in the drawings or described in the specification in a particular order, such operations need not be performed in the particular order shown or in sequential order, or that all operations be performed, to achieve desirable results. Other operations that are not depicted or described can be incorporated in the example methods and processes. For example, one or more additional operations can be performed before, after, simultaneously, or between any of the described operations. Further, the operations may be rearranged or reordered in other implementations. Those skilled in the art will appreciate that in some embodiments, the actual steps taken in the processes illustrated and/or disclosed may differ from those shown in the figures. Depending on the embodiment, certain of the steps described above may be removed, others may be added. Furthermore, the features and attributes of the specific embodiments disclosed above may be combined in different ways to form additional embodiments, all of which fall within the scope of the present disclosure. Also, the separation of various system components in the implementations described above should not be understood as requiring such separation in all implementations, and it should be understood that the described components and systems can generally be integrated together in a single product or packaged into multiple products.

For purposes of this disclosure, certain aspects, advantages, and novel features are described herein. Not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel"

refer to a value, amount, or characteristic that departs from exactly parallel by less than or equal to 15 degrees, 10 degrees, 5 degrees, 3 degrees, 1 degree, or 0.1 degree.

The scope of the present disclosure is not intended to be limited by the specific disclosures of preferred embodiments in this section or elsewhere in this specification, and may be defined by claims as presented in this section or elsewhere in this specification or as presented in the future. The language of the claims is to be interpreted broadly based on the language employed in the claims and not limited to the examples described in the present specification or during the prosecution of the application, which examples are to be construed as non-exclusive.

Of course, the foregoing description is that of certain features, aspects and advantages of the present invention, to which various changes and modifications can be made without departing from the spirit and scope of the present invention. Moreover, the devices described herein need not feature all of the objects, advantages, features and aspects discussed above. Thus, for example, those of skill in the art will recognize that the invention can be embodied or carried out in a manner that achieves or optimizes one advantage or a group of advantages as taught herein without necessarily achieving other objects or advantages as may be taught or suggested herein. In addition, while a number of variations of the invention have been shown and described in detail, other modifications and methods of use, which are within the scope of this invention, will be readily apparent to those of skill in the art based upon this disclosure. It is contemplated that various combinations or subcombinations of these specific features and aspects of embodiments may be made and still fall within the scope of the invention. Accordingly, it should be understood that various features and aspects of the disclosed embodiments can be combined with or substituted for one another in order to form varying modes of the discussed devices.

What is claimed is:

1. A piezoelectric sensor, comprising:
   a substrate;
   a cantilever beam having a proximal portion attached to the substrate and extending to an unsupported distal end of the beam; and
   an electrode disposed on or in the proximal portion of the beam, the electrode having an outer boundary with a shape substantially corresponding to a contour line of a strain distribution plot for the cantilever beam resulting from a force applied to the cantilever beam.

2. The sensor of claim 1 wherein the cantilever beam is a triangular beam, the unsupported distal end being a distal tip of the triangular beam.

3. The sensor of claim 1 wherein at least a portion of two edges of the outer boundary of the electrode are disposed inward of a pair of outer edges of the cantilever beam.

4. The sensor of claim 1 wherein two corners of the proximal portion of the cantilever beam are not covered by the electrode.

5. The sensor of claim 1 wherein at least a portion of the outer boundary of the electrode is non-linear.

6. The sensor of claim 1 wherein the cantilever beam has a rectangular shape.

7. A piezoelectric microelectromechanical systems microphone, comprising:
   a substrate; and
   a plurality of piezoelectric sensors movably coupled to the substrate, each of the piezoelectric sensors spaced apart from an adjacent piezoelectric sensor by a gap and including: a cantilever beam having a proximal portion attached to the substrate and extending to an unsupported distal end of the beam, and an electrode disposed on or in the proximal portion of the beam, the electrode having an outer boundary with a shape substantially corresponding to a contour line of a strain distribution plot for the cantilever beam resulting from a force applied to the cantilever beam, the plurality of piezoelectric sensors configured to deflect when subjected to sound pressure.

8. The microphone of claim 7 wherein the cantilever beam is a triangular beam, the unsupported distal end being a distal tip of the triangular beam.

9. The microphone of claim 7 wherein at least a portion of two edges of the outer boundary of the electrode are disposed inward of a pair of outer edges of the cantilever beam.

10. The microphone of claim 7 wherein two corners of the proximal portion of the cantilever beam are not covered by the electrode.

11. The microphone of claim 7 wherein at least a portion of the outer boundary of the electrode is non-linear.

12. The microphone of claim 7 wherein the cantilever beam has a rectangular shape.

13. An audio subsystem, comprising:
    an audio codec; and
    one or more piezoelectric microelectromechanical systems microphones in communication with the audio codec, each microphone including: a substrate and a plurality of piezoelectric sensors movably coupled to the substrate, each of the piezoelectric sensors spaced apart from an adjacent piezoelectric sensor by a gap and including a cantilever beam having a proximal portion attached to the substrate and extending to an unsupported distal end of the beam, and an electrode disposed on or in the proximal portion of the beam, the electrode having an outer boundary with a shape substantially corresponding to a contour line of a strain distribution plot for the cantilever beam resulting from a force applied to the cantilever beam.

14. The audio subsystem of claim 13 wherein the cantilever beam is a triangular beam, the unsupported distal end being a distal tip of the triangular beam.

15. The audio subsystem of claim 13 wherein at least a portion of two edges of the outer boundary of the electrode are disposed inward of a pair of outer edges of the cantilever beam.

16. The audio subsystem of claim 13 wherein two corners of the proximal portion of the cantilever beam are not covered by the electrode.

17. The audio subsystem of claim 13 wherein at least a portion of the outer boundary of the electrode is non-linear.

18. The audio subsystem of claim 13 wherein the cantilever beam has a rectangular shape.

* * * * *